United States Patent [19]

Shih

[11] Patent Number: 5,827,782

[45] Date of Patent: Oct. 27, 1998

[54] MULTIPLE ETCH METHOD FOR OPTIMIZING INTER-METAL DIELECTRIC (IMD) SPACER LAYER PROFILE

[75] Inventor: Tsu Shih, Chawa, Taiwan

[73] Assignee: Taiwan Semiconductor Manufacturing Company, Ltd., Hsin-Chu, Taiwan

[21] Appl. No.: 657,069

[22] Filed: Jun. 3, 1996

[51] Int. Cl.$^6$ ............... H01L 21/469; H01L 21/302; H01L 21/465
[52] U.S. Cl. ............ 438/697; 438/592; 438/626; 438/631
[58] Field of Search ............ 438/631; 437/225, 437/228, 235, 231, 978

[56] References Cited

U.S. PATENT DOCUMENTS

| | | | |
|---|---|---|---|
| 5,382,547 | 1/1995 | Sultan et al. | 437/231 |
| 5,639,345 | 6/1997 | Huang et al. | 156/657.1 |
| 5,665,657 | 9/1997 | Lee | 438/624 |

*Primary Examiner*—Susan A. Loring
*Attorney, Agent, or Firm*—George O. Saile; Stephen B. Ackerman; Alek P. Szecsy

[57] ABSTRACT

A method for forming a Spin-On-Glass (SOG) residue free Inter-Metal Dielectric (IMD) spacer layer as a substrate layer for a void free conformal insulator layer within a high aspect ratio exceedingly narrowly spaced patterned layer within an integrated circuit. First there is provided a semiconductor substrate having formed thereupon a patterned layer. The patterned layer has a first aperture formed therein. Formed upon the patterned layer and into the first aperture is a conformal Inter-Metal Dielectric (IMD) layer. The conformal Inter-Metal Dielectric (IMD) layer has a second aperture formed therein where the conformal Inter-Metal Dielectric (IMD) layer is formed into the first aperture. Formed upon the conformal Inter-Metal Dielectric (IMD) layer and filling the second aperture is a planarizing Spin-On-Glass (SOG) layer. There is then etched selectively and isotropically through a selective and isotropic etch the planarizing Spin-On-Glass (SOG) layer to leave remaining a Spin-On-Glass (SOG) layer residue within the second aperture. Finally, there is then etched non-selectively and anisotropically through a non-selective and anisotropic etch the Spin-On-Glass (SOG) layer residue and the conformal Inter-Metal Dielectric (IMD) layer to leave remaining an Inter-Metal Dielectric (IMD) spacer layer adjoining the patterned layer.

22 Claims, 8 Drawing Sheets

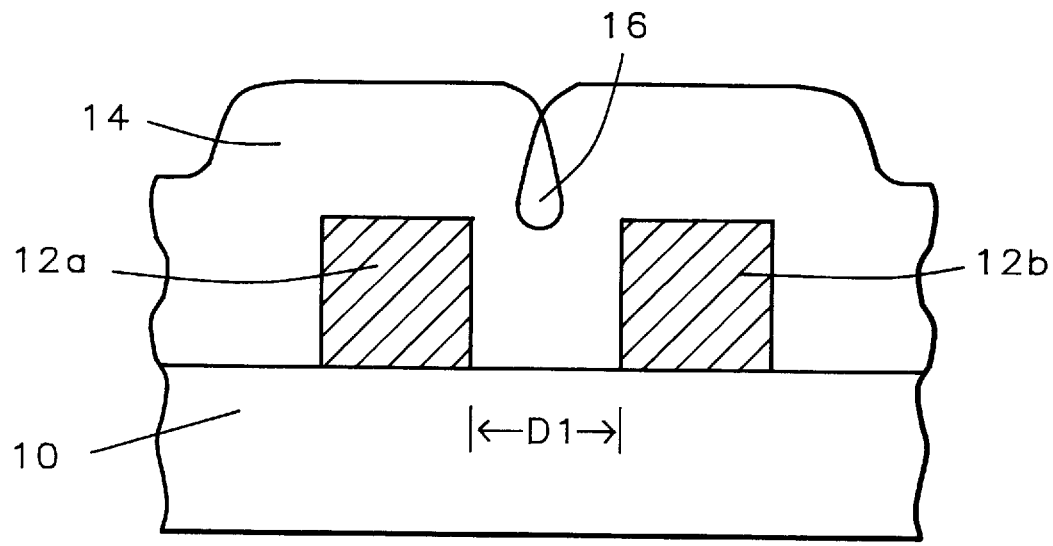
FIG. 1 — Prior Art
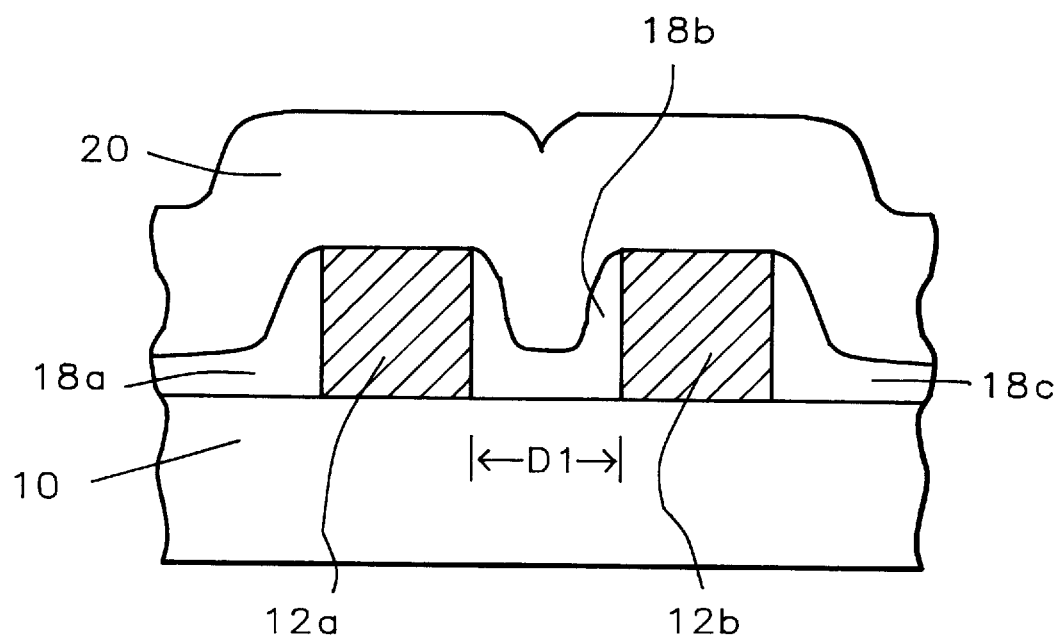
FIG. 2 — Prior Art

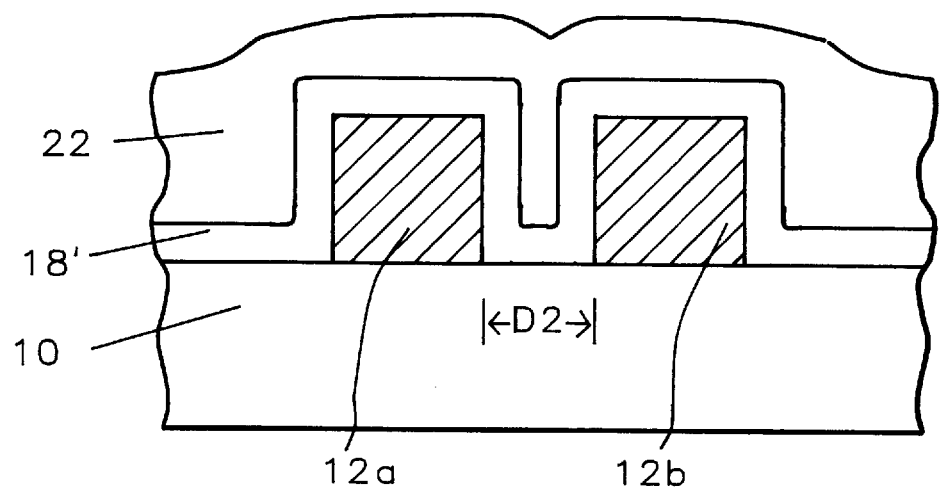
FIG. 3 — Prior Art
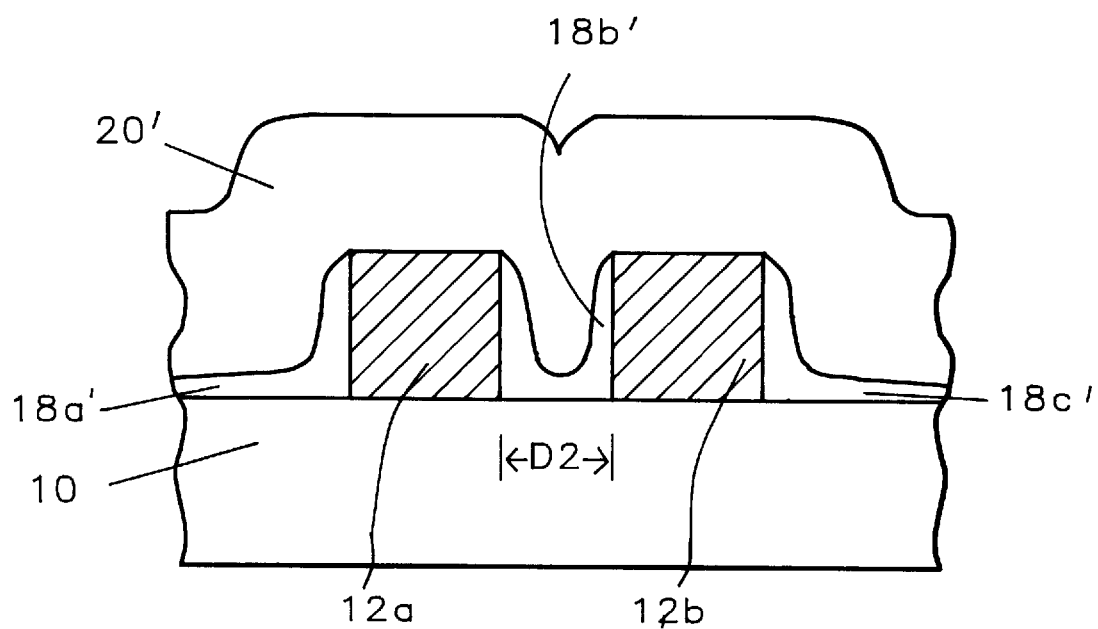
FIG. 4 — Prior Art

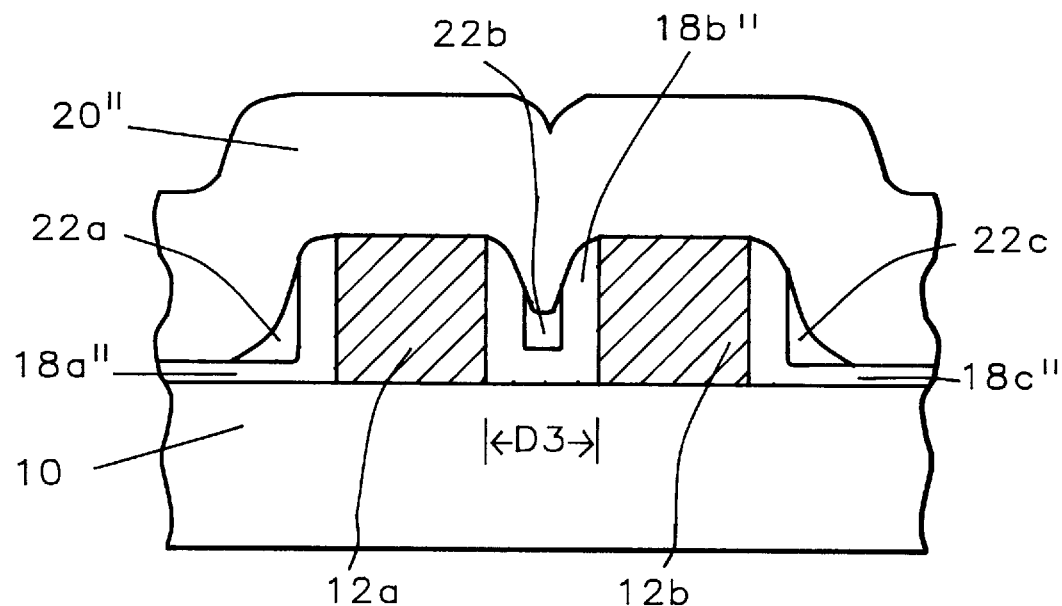
FIG. 5 - Prior Art
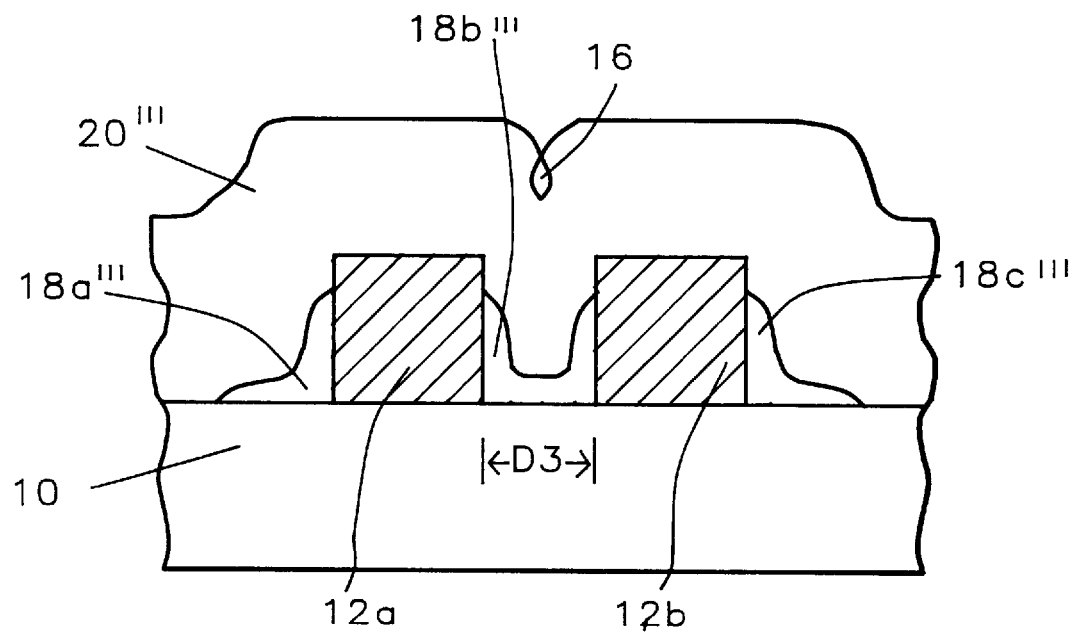
FIG. 6 - Prior Art

MULTIPLE ETCH METHOD FOR OPTIMIZING INTER-METAL DIELECTRIC (IMD) SPACER LAYER PROFILE

BACKGROUND OF THE INVENTION

1. Field of the Invention

The present invention relates generally to Inter-Metal Dielectric (IMD) spacer layers within integrated circuits. More particularly, the present invention relates to etch methods for optimizing profiles of Inter-Metal Dielectric (IMD) spacer layers within integrated circuits.

2. Description of the Related Art

Integrated circuits are formed from semiconductor substrates within and upon whose surfaces are formed transistors, resistors, diodes and other electrical circuit elements. These electrical circuit elements are connected internally and externally to the semiconductor substrate upon which they are formed through patterned conductor layers which are separated by insulator layers.

As integrated circuit technology has advanced, and integrated circuit device dimensions have decreased, the challenges of forming void free conformal insulator layers between and upon high aspect ratio narrowly spaced patterned conductor layers within integrated circuits have increased. The traditional limitations in forming void free conformal insulator layers between and upon high aspect ratio narrowly spaced patterned conductor layers are illustrated by reference to FIG. 1.

Shown in FIG. 1 is a substrate layer 10 upon whose surface resides a pair of high aspect ratio narrowly spaced patterned conductor layers 12a and 12b separated by a distance D1. When forming a conformal insulator layer 14 between and upon the surfaces of the high aspect ratio narrowly spaced patterned conductor layers 12a and 12b, a void 16 is often simultaneously formed above the surfaces of the high aspect ratio narrowly spaced patterned conductor layers 12a and 12b at a location where a seam is formed as the conformal insulator layer 14 is grown between the high aspect ratio narrowly spaced patterned conductor layers 12a and 12b. The void 16 results from inhomogeneous filling from the two sides of the conformal insulator layer 14 as the seam is formed.

In order to avoid void 16 formation under the conditions outlined above, a two-layer insulator layer structure, the schematic cross-sectional diagram of which is illustrated by reference to FIG. 2, is often employed. Illustrated in FIG. 2 are Inter-Metal Dielectric (IMD) spacer layers 18a, 18b and 18c which are formed upon: (1) the exposed surfaces of the substrate layer 10, and (2) the adjoining exposed surfaces of the high aspect ratio narrowly spaced patterned conductor layers 12a and 12b, prior to forming upon those surfaces a conformal insulator layer 20. The Inter-Metal Dielectric (IMD) spacer layers 18a, 18b and 18c are typically formed through anisotropic Reactive Ion Etch (RIE) etching of a conformal Inter-Metal Dielectric (IMD) layer formed upon the exposed surfaces of the substrate layer 10 and the high aspect ratio narrowly spaced patterned conductor layers 12a and 12b.

Although the integrated circuit structure illustrated in FIG. 2 has proven quite valuable in forming void free conformal insulator layers between and upon high aspect ratio narrowly spaced patterned conductor layers within integrated circuits, the method through which the structure illustrated in FIG. 2 is formed has fundamental limitations. The fundamental limitations are reached when the high aspect ratio narrowly spaced patterned conductor layers 12a and 12b become more narrowly spaced such that a void is formed between adjoining portions of the conformal Inter-Metal Dielectric (IMD) layer from which is formed the Inter-Metal Dielectric (IMD) spacer layers 18a, 18b and 18c prior to the point at which the conformal Inter-Metal Dielectric (IMD) layer has grown to sufficient thickness such that adequately sized Inter-Metal Dielectric (IMD) spacer layers 18a, 18b and 18c may be formed from the conformal Inter-Metal Dielectric (IMD) layer through a Reactive Ion Etch (RIE) etch process. Under such circumstances, alternative integrated circuit structures similar to the schematic crosssectional integrated circuit structures illustrated in FIG. 3 and FIG. 4 are employed in forming Inter-Metal Dielectric (IMD) spacer layers of appropriate size. The integrated circuit structures as illustrated in FIG. 3 and FIG. 4 are disclosed by Sultan et al., in U.S. Pat. No. 5,382,547.

Shown in FIG. 3 is a substrate layer 10 upon whose surface resides high aspect ratio narrowly spaced patterned conductor layers 12a and 12b separated by a distance D2 which is less than the distance D1 illustrated in FIG. 1 and FIG. 2. Upon the surfaces of the substrate layer 10 and the high aspect ratio narrowly spaced patterned conductor layers 12a and 12b is formed a conformal Inter-Metal Dielectric (IMD) layer 18' of sufficiently limited thickness such that a void does not form in the aperture of the conformal Inter-Metal Dielectric (IMD) layer 18' between the high aspect ratio narrowly spaced patterned conductor layers 12a and 12b. Formed then upon the surface of the conformal Inter-Metal Dielectric (IMD) layer 18' and into the aperture in the conformal Inter-Metal Dielectric (IMD) layer 18' between the high aspect ratio narrowly spaced patterned conductor layers 12a and 12b is a sacrifical planarizing Spin-On-Glass (SOG) insulator layer 22. As is known in the art, the planarizing Spin-On-Glass (SOG) insulator layer 22 possesses excellent gap filling and planarizing properties. As is also known in the art, the planarizing Spin-On-Glass (SOG) insulator layer 22 also possesses inferior dielectric properties and inferior moisture impermeability properties.

Since conformal Inter-Metal Dielectric (IMD) layers and planarizing Spin-On-Glass (SOG) insulator layers in general typically have similar etch rates in Reactive Ion Etch (RIE) etch processes, there may be formed, as illustrated in FIG. 4, Inter-Metal Dielectric (IMD) spacer layers 18a', 18b' and 18c' which provide a foundation upon which conformal insulator layer 20' may be formed without forming voids in conformal insulator layer 20'. As is also illustrated in FIG. 4 the sacrificial planarizing Spin-On-Glass (SOG) insulator layer 22 illustrated in FIG. 3 has been completely consumed in the Reactive Ion Etch (RIE) etch process through which are formed the Inter-Metal Dielectric (IMD) spacer layers 18a', 18b' and 18c' from the conformal Inter-Metal Dielectric (IMD) layer 18'.

Although the method by which is formed the integrated circuit structures illustrated in FIG. 3 and FIG. 4 is a viable method through which Inter-Metal Dielectric (IMD) spacer layers may be formed adjoining more narrowly spaced high aspect ratio narrowly spaced patterned conductor layers, the method by which is formed the integrated circuit structures illustrated by FIG. 3 and FIG. 4 also encounters fundamental limitations as spacings between high aspect ratio narrowly spaced patterned conductor layers become exceedingly narrow. The fundamental limitations in such circumstances relate to the ability to remove all of the sacrificial planarizing Spin-On-Glass (SOG) insulator layer 22 while simultaneously forming adequately sized Inter-Metal Dielectric (IMD) spacer layers 18a', 18b' and 18c' through a Reactive Ion Etch (RIE) etch process within which the sacrificial planarizing Spin-On-Glass (SOG) insulator layer 22 and the conformal Inter-Metal Dielectric (IMD) layer 18' have similar etch rates. The two limits of this problem are illustrated in FIG. 5 and FIG. 6.

Illustrated in FIG. 5 is an integrated circuit structure where adequately sized Inter-Metal Dielectric (IMD) spacer layers are formed as substrate layers for a void free conformal insulator layer 20". Unfortunately, the adequately sized Inter-Metal Dielectric (IMD) spacer layers are formed of composite layers of partially etched conformal Inter-Metal Dielectric (IMD) layers 18a", 18b" and 18c", upon which remain, respectively, Spin-On-Glass (SOG) insulator layer residues 22a, 22b and 22c. The SpinOn-Glass (SOG) insulator layer residues 22a, 22b and 22c provide inferior dielectric characteristics and inferior moisture impermeability characteristics to the integrated circuit structure.

Illustrated in FIG. 6 is a corresponding semiconductor structure where the Spin-On-Glass (SOG) insulator layer residues 22a, 22b and 22c have been completely removed. Unfortunately, the amount of Reactive Ion Etch (RIE) etching required to completely remove the Spin-On-Glass (SOG) insulator layer residues 22a, 22b and 22c also forms, through over-etching, the Inter-Metal Dielectric (IMD) spacer layers 18a'", 18b'" and 18c'" of an inadequately small size, thus allowing a void 16 to form within the conformal insulator layer 20'".

It is thus an object of the present invention to provide a method whereby Spin-On-Glass (SOG) residue free Inter-Metal Dielectric (IMD) spacer layers may be formed within high aspect ratio narrowly spaced patterned conductor layers within integrated circuits to provide Inter-Metal Dielectric (IMD) spacer layers upon which may subsequently be formed void free conformal insulator layers.

SUMMARY OF THE INVENTION

An object of the present invention is to provide a method whereby Spin-On-Glass (SOG) residue free Inter-Metal Dielectric (IMD) spacer layers may be formed within high aspect ratio narrowly spaced patterned conductor layers within integrated circuits to provide substrate layers upon which may subsequently be formed void free conformal insulator layers.

A second object of the present invention is to provide a method in accord with the first object of the present invention, which method is also manufacturable.

In accord with the objects of the present invention there is provided a method whereby Spin-On-Glass (SOG) residue free Inter-Metal Dielectric (IMD) spacer layers may be formed within high aspect ratio narrowly spaced patterned layers within integrated circuits to provide substrate layers upon which may subsequently be formed void free conformal insulator layers. To form the Inter-Metal Dielectric (IMD) spacer layers of the present invention there is first provided a semiconductor substrate having formed thereupon a patterned layer. The patterned layer has a first aperture formed therein. Formed upon the patterned layer and into the first aperture is a conformal Inter-Metal Dielectric (IMD) layer. The conformal Inter-Metal Dielectric (IMD) layer has a second aperture formed therein where the conformal Inter-Metal Dielectric (IMD) layer is formed into the first aperture. Formed upon the conformal Inter-Metal Dielectric (IMD) layer and filling the second aperture is a planarizing Spin-On-Glass (SOG) insulator layer. There is then etched selectively and isotropically through a selective and isotropic etch the planarizing Spin-On-Glass (SOG) insulator layer to leave remaining a Spin-On-Glass (SOG) insulator layer residue within the second aperture. Finally, there is then etched non-selectively and anisotropically through a non-selective and anisotropic etch the Spin-On-Glass (SOG) insulator layer residue and the conformal Inter-Metal Dielectric (IMD) layer to leave remaining an Inter-Metal Dielectric (IMD) spacer layer adjoining the patterned layer.

The present invention provides a method whereby Spin-On-Glass residue free Inter-Metal Dielectric (IMD) spacer layers may be formed within high aspect ratio narrowly spaced patterned conductor layers within integrated circuits to provide substrate layers upon which may subsequently be formed void free conformal insulator layers. By providing a two-step multiple step etch method, the method of the present invention provides a means for conveniently and accurately adjusting the profile, and therefore the composition, of the Inter-Metal Dielectric (IMD) spacer layer of the present invention.

In the first etch step of the two-step multi step etch method, the planarizing Spin-On-Glass (SOG) insulator layer portion of a planarizing Spin-On-Glass (SOG) insulator layer/conformal Inter-Metal Dielectric (IMD) layer composite insulator layer from which is formed the Inter-Metal Dielectric (IMD) spacer layer of the present invention is etched in a selective and isotropic etch to leave remaining a Spin-On-Glass (SOG) insulator layer residue upon the conformal Inter-Metal Dielectric (IMD) layer. In the second etch step of the two-step multi step etch method the Spin-On-Glass (SOG) insulator layer residue and the underlying conformal Inter-Metal Dielectric (IMD) layer are etched in a non-selective and anisotropic etch to provide the Inter-Metal Dielectric (IMD) spacer layer of the present invention. Through the two-step multi step etch method of the present invention there is formed a Spin-On-Glass (SOG) residue free Inter-Metal Dielectric (IMD) spacer layer of appropriate size and contour such that a void free conformal insulator layer may be formed upon the Spin-On-Glass (SOG) residue free Inter-Metal Dielectric (IMD) spacer layer.

The method of the present invention is readily manufacturable. The method of the present invention provides that a Spin-On-Glass (SOG) residue free Inter-Metal Dielectric (IMD) spacer layer may be formed from a planarizing Spin-On-Glass (SOG) insulator layer/conformal Inter-Metal Dielectric (IMD) layer composite insulator layer by sequentially etching the planarizing Spin-On-Glass (SOG) insulator layer/conformal Inter-Metal Dielectric (IMD) layer composite insulator layer with: (1) a selective and isotropic etch, followed by, (2) a non-selective and anisotropic etch. Both selective and isotropic etches, and non-selective and anisotropic etches are known in the art. Sequential implementation of such etch methods provides a readily manufacturable method for etching a composite insulator layer.

BRIEF DESCRIPTION OF THE DRAWINGS

The accompanying drawings, which form a material part of this disclosure, show the following:

FIG. 1 shows a schematic cross-sectional diagram illustrating void formation within a conformal insulator layer formed upon a high aspect ratio narrowly spaced patterned conductor layer of the prior art.

FIG. 2 shows a schematic cross-sectional diagram illustrating void avoidance within a conformal insulator layer formed upon a high aspect ratio narrowly spaced patterned conductor layer of the prior art by first forming upon the high aspect ratio narrowly spaced patterned conductor layer an Inter-Metal Dielectric (IMD) spacer layer.

FIG. 3 and FIG. 4 show a pair of schematic crosssectional diagrams illustrating progressive stages in forming Inter-Metal Dielectric (IMD) spacer layers between a more narrowly spaced high aspect ratio narrowly spaced patterned conductor layer while employing a sacrificial planarizing Spin-On-Glass (SOG) insulator layer of the prior art.

FIG. 5 shows a cross-sectional schematic diagram illustrating the problem of Spin-On-Glass (SOG) insulator layer residue formation when the method as illustrated in FIG. 3 and FIG. 4 is applied to an exceedingly narrowly spaced high aspect ratio narrowly spaced patterned conductor layer.

FIG. 6 shows a cross-sectional schematic diagram illustrating the problem of conformal insulator layer void formation when the method as illustrated in FIG. 3 and FIG. 4 is applied to an exceedingly narrowly spaced high aspect ratio narrowly spaced patterned conductor layer.

DESCRIPTION OF THE PREFERRED EMBODIMENT

The present invention provides a method for forming a Spin-On-Glass (SOG) residue free Inter-Metal Dielectric (IMD) spacer layer within an exceedingly narrowly spaced high aspect ratio narrowly spaced patterned layer within an integrated circuit, to provide a substrate layer upon which may subsequently be formed a void free conformal insulator layer. The method of the present invention accomplishes this goal through use of a two-step multi step etch method. The two-step multi step etch method of the present invention provides a means for conveniently and accurately adjusting the profile, and therefore the composition, of the Inter-Metal Dielectric (IMD) spacer layer of the present invention.

The method of the present invention may be employed in forming Spin-On-Glass (SOG) residue free Inter-Metal Dielectric (IMD) spacer layers within exceedingly narrowly spaced high aspect ratio patterned layers to serve as substrate layers for void free conformal insulator layers within various locations of an integrated circuit. The method of the present invention may be employed in forming Spin-On-Glass (SOG) residue free Inter-Metal Dielectric (IMD) spacer layers upon which may be formed void free conformal insulator layers which comprise the first conformal insulator layer within an integrated circuit. The first conformal insulator layer separates the semiconductor substrate from the first patterned conductor layer of an integrated circuit. Alternatively, the method of the present invention may be employed in forming Spin-On-Glass (SOG) residue free Inter-Metal Dielectric (IMD) spacer layers upon which in turn may be formed void free conformal insulator layers other than the first insulator layer within an integrated circuit.

In addition to forming Spin-On-Glass (SOG) residue free Inter-Metal Dielectric (IMD) spacer layers upon which may be formed void free conformal insulator layers within various locations of an integrated circuit, the method of the present invention may also be employed in forming Spin-On-Glass (SOG) residue free Inter-Metal Dielectric (IMD) spacer layers within exceedingly narrowly spaced high aspect ratio narrowly spaced patterned layers within various types of integrated circuits. The method of the present invention may be employed within Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in forming Spin-On-Glass (SOG) residue free Inter-Metal Dielectric (IMD) spacer layers within integrated circuits.

Figure 7:
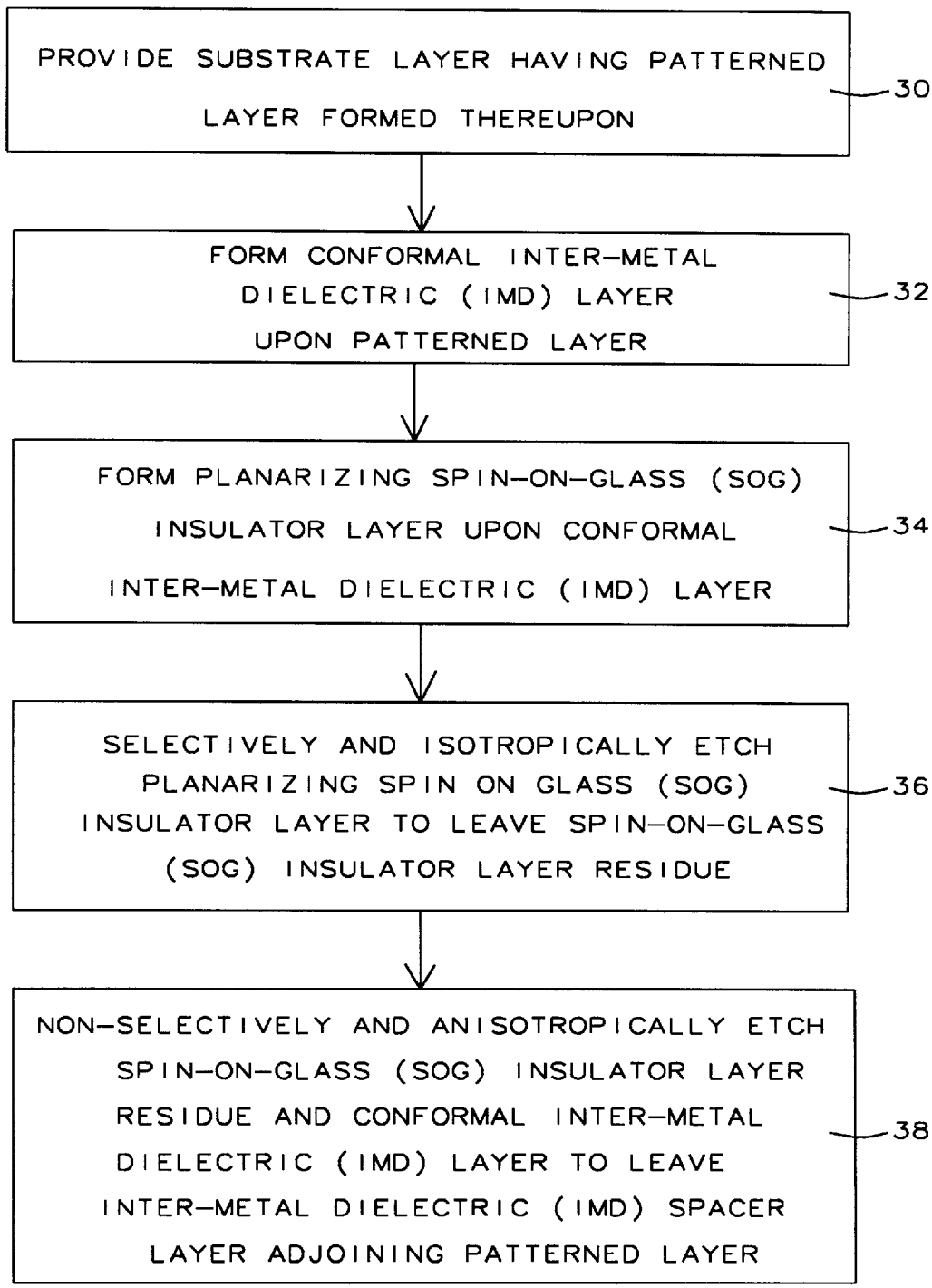
FIG. 7 shows a process flow schematic diagram illustrating the process steps in forming the Spin-On-Glass (SOG) residue free Inter-Metal Dielectric (IMD) spacer layer of the present invention within an exceedingly narrowly spaced high aspect ratio narrowly spaced patterned layer.

Referring now to FIG. 7, there is shown a schematic process flow diagram illustrating the individual process steps in forming the Spin-On-Glass (SOG) residue free Inter-Metal Dielectric (IMD) spacer layer of the preferred embodiment of the present invention. The process steps as illustrated in FIG. 7 provide the general method by which may be practiced the present invention. Further requirements, limits and parameters of the individual process steps are disclosed along with the more complete description of the preferred embodiment of the present invention, which follows.

Illustrated by reference numeral 30 is the first process step in the general method of the present invention. Within the first process step there is provided a substrate layer upon which is formed a patterned layer. Although the method of the present invention is most likely to be practiced upon a semiconductor substrate upon whose surface is formed a patterned conductor layer, other substrate layers and other patterned layers, including but not limited to patterned insulator layers and patterned semiconductor layers upon semiconductor substrates may also be employed in practice of the present invention.

As illustrated by reference numeral 32, there is then formed a conformal Inter-Metal Dielectric (IMD) layer upon the patterned layer, and as illustrated by reference numeral 34 there is then formed a planarizing Spin-On-Glass (SOG) insulator layer upon the conformal Inter-Metal Dielectric (IMD) layer. Thus, at this point in the method of the present invention there is formed a planarizing Spin-On-Glass (SOG) insulator layer/conformal Inter-Metal Dielectric (IMD) layer composite insulator layer upon a patterned layer which resides upon a substrate layer. Upon this composite insulator layer is performed the two-step multi step etch method of the present invention.

As illustrated by reference numeral 36, within the first etch step of the two-step multi step etch method the planarizing Spin-On-Glass (SOG) insulator layer component of the composite insulator layer is selectively and isotropically etched to leave remaining a Spin-On-Glass (SOG) insulator layer residue upon the surface of the conformal Inter-Metal Dielectric (IMD) layer. As illustrated by reference numeral 38, within the second etch step of the two-step multi step etch method the Spin-On-Glass (SOG) insulator layer residue and the conformal Inter-Metal Dielectric (IMD) layer are then etched to leave remaining an Inter-Metal Dielectric (IMD) spacer layer adjoining the patterned layer. The second etch step of the two-step multi step etch method of the present invention provides a Spin-On-Glass (SOG) residue free Inter-Metal Dielectric (IMD) spacer layer upon whose surface may be formed a void free conformal insulator layer.

Referring now to FIG. 8 to FIG. 13 there is shown a series of schematic cross-sectional diagrams illustrating progressive stages in forming an integrated circuit into which is formed multiple Spin-On-Glass (SOG) residue free Inter-Metal Dielectric (IMD) spacer layers through the method of the present invention. The integrated circuit as illustrated by reference to FIG. 8 to FIG. 13 represents the preferred embodiment of the present invention.

Figure 8:
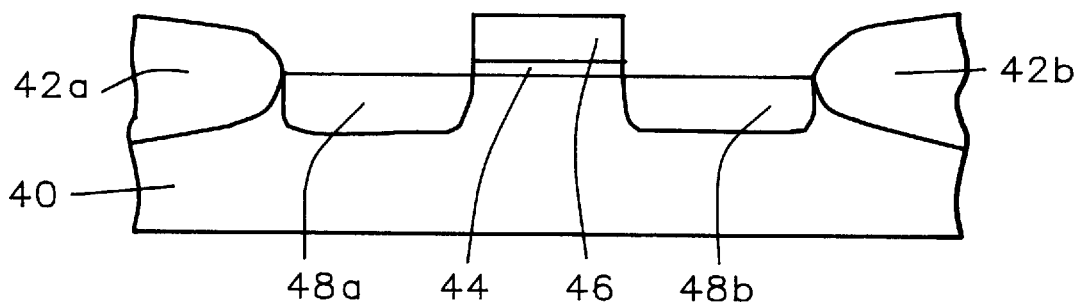
FIG. 8 to FIG. 13 show a series of schematic cross-sectional diagrams illustrating progressive stages in forming the Spin-On-Glass (SOG) residue free Inter-Metal Dielectric (IMD) spacer layer of the present invention within an exceedingly narrowly spaced high aspect ratio narrowly spaced patterned conductor layer within an integrated circuit, thus providing the preferred embodiment of the present invention.

Shown in FIG. 8 is a semiconductor substrate 40 upon and within whose surface there are formed isolation regions 42a and 42b. Semiconductor substrates upon which the present invention may be practiced may be formed with either dopant polarity, any dopant concentration and any crystallographic orientation. Typically, the semiconductor substrate 40 upon which is practiced the present invention is a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate. For the preferred embodiment of the present invention, the isolation regions 42a and 42b are preferably formed through a thermal oxidation process whereby portions of the semiconductor substrate 40 exposed through an oxidation mask are consumed to form within and upon the semiconductor substrate 40 isolation regions 42a and 42b of silicon oxide.

Also illustrated within FIG. 8 is a gate oxide layer 44 upon which resides a gate electrode 46. Both the gate oxide layer 44 and the gate electrode 46 reside upon the active semiconductor region of the semiconductor substrate 40. Both the gate oxide layer 44 and the gate electrode 46 are components of a field effect transistor.

Methods and materials through which gate oxide layers and gate electrodes may be formed upon active semiconductor regions of semiconductor substrates are known in the art. Gate oxide layers may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art to form gate oxide layers.

Gate electrodes are typically formed via patterning and etching, through methods as are conventional in the art, of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the present invention, the gate oxide layer 44 is preferably formed through patterning of a blanket gate oxide layer formed through thermal oxidation of the active semiconductor region of semiconductor substrate 40 at a temperature of about 800 to about 1000 degrees centigrade to yield a typical blanket gate oxide layer thickness of about 60 to about 140 angstroms. For the preferred embodiment of the present invention, the gate electrode 46 is preferably formed by patterning and etching a blanket layer of highly doped polysilicon formed upon the blanket gate oxide layer at a thickness of about 2000 to about 3000 angstroms through a Chemical Vapor Deposition (CVD) process employing silane as the silicon source material along with suitable dopant species. Once the blanket layer of highly doped polysilicon has been patterned to yield the gate electrode 46, the gate electrode 46 may be used as an etch mask to pattern the gate oxide layer 44 from the blanket gate oxide layer.

Finally, there is shown in FIG. 8 source/drain electrodes 48a and 48b formed within the surface of the active semiconductor region of the semiconductor substrate 40 at areas not occupied by the gate electrode 46, the gate oxide layer 44 and the isolation regions 42a and 42b. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Arsenic dopant species, boron dopant species and phosphorus dopant species are common in the art. For the preferred embodiment of the present invention, the source/drain electrodes 48a and 48b are preferably formed through implanting a suitable dopant species into the active region of the semiconductor substrate 40 at about 1E14 to about 1E16 ions per square centimeter dose and about 50 to about 150 keV ion implantation energy.

Having formed a field effect transistor structure comprising source/drain electrodes 48a and 48b formed into the semiconductor substrate 40, and a gate electrode 46 upon a gate oxide layer 44 adjoining the source/drain electrodes 48a and 48b, further process steps in forming the Spin-On-Glass (SOG) residue free Inter-Metal Dielectric (IMD) spacer layer within the preferred embodiment of the present invention may proceed. The results of the first of these further process steps are illustrated in FIG. 9.

Figure 9:
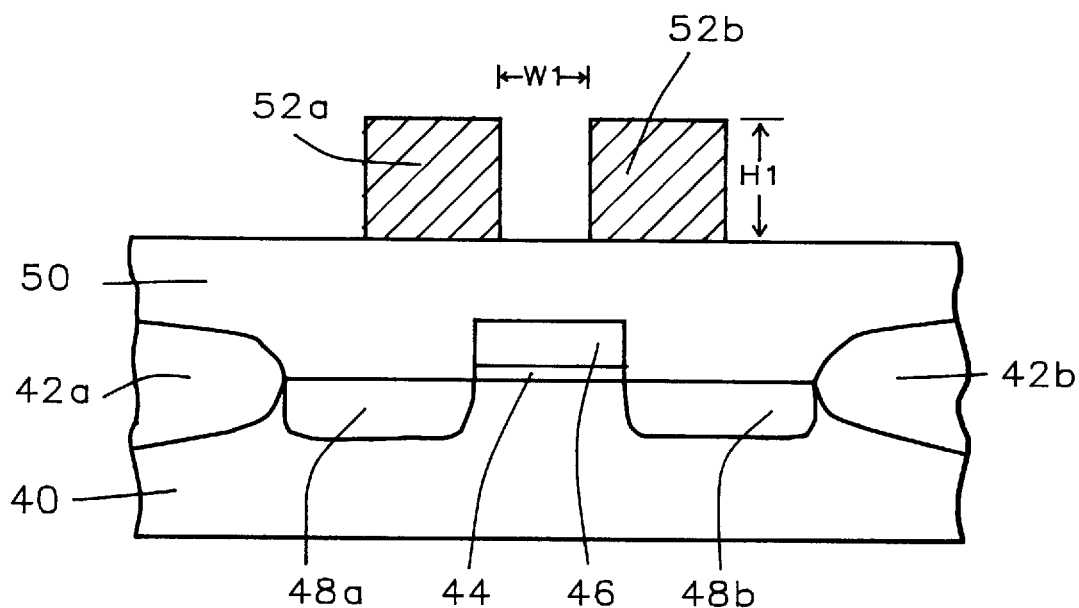

Shown in FIG. 9 is a planarized Pre-Metal Dielectric (PMD) layer formed upon the surface of the integrated circuit structure illustrated in FIG. 8. Methods and materials by which may be formed and planarized Pre-Metal Dielectric (PMD) layers are known in the art of integrated circuit design and manufacturing. Pre-Metal Dielectric (PMD) layers may be formed from materials including but not limited to silicon oxide materials, silicon nitride materials and silicon oxynitride materials, formed upon the surfaces of semiconductor substrates through methods including but not limited to Chemical Vapor Deposition (CVD) methods, Plasma Enhanced Chemical Vapor Deposition (PECVD) methods and Physical Vapor Deposition (PVD) sputtering methods. Additionally, Pre-Metal Dielectric (PMD) layers may be planarized through methods conventional to the art, including but not limited to Reactive Ion Etch (RIE) etchback planarizing methods and Chemical Mechanical Polish (CMP) planarizing methods.

For the preferred embodiment of the present invention, the planarized Pre-Metal Dielectric (PMD) layer 50 is preferably formed from a silicon oxide material formed through a Plasma Enhanced Chemical Vapor Deposition method and planarized through a Chemical Mechanical Polish (CMP) planarizing method, as is conventional to the art. Other methods and materials may, however, be employed.

Also shown in FIG. 9 is the presence of first high aspect ratio narrowly spaced patterned conductor layers 52a and 52b having formed there-between a first aperture of width W1 and height H1. The method of the present invention provides value in forming within the first aperture Spin-On-Glass (SOG) residue free Inter-Metal Dielectric (IMD) spacer layers when the first high aspect ratio narrowly spaced patterned conductor layers 52a and 52b are exceedingly narrowly spaced, thereby providing an exceedingly narrow aperture. For the preferred embodiment of the present invention, the first aperture preferably has a width W1 of from about 2000 to about 20000 angstroms and a height H1 of from about 5000 to about 10000 angstroms.

Methods and materials through which may be formed patterned conductor layers within integrated circuits are known in the art. Patterned conductor layers are typically although not exclusively formed through patterning, through methods as are convention in the art, of blanket conductor layers which are formed upon the surfaces of semiconductor substrates through methods including but not limited to thermally assisted evaporation methods, Physical Vapor Deposition (PVD) sputtering methods and Chemical Vapor Deposition (CVD) methods. Blanket conductor layers from which are formed patterned conductor layers may be formed from conductive materials including but not limited to metals, metal alloys, highly doped polysilicon and polycides (polysilicon/metal silicide stacks). For the preferred embodiment of the present invention, the first high aspect ratio narrowly spaced patterned conductor layers 52a and 52b will typically, although not exclusively be formed at least in part of an aluminum containing alloy.

Figure 10:
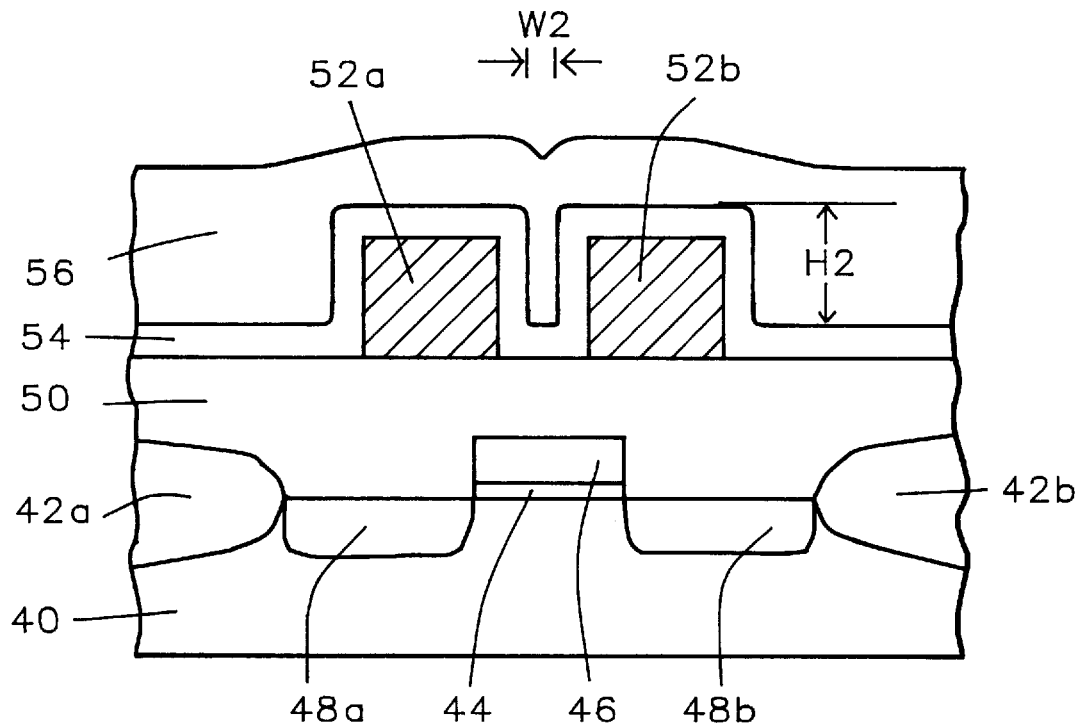

Referring now to FIG. 10, there is shown a schematic cross-sectional diagram illustrating the result of further stages in processing of the integrated circuit whose structure is illustrated in FIG. 9. Shown in FIG. 10 is the presence of a first conformal Inter-Metal Dielectric (IMD) layer 54 formed upon the surface of the integrated circuit structure illustrated in FIG. 9 and into the first aperture between the first high aspect ratio narrowly spaced patterned conductor layers 52a and 52b. The first conformal Inter-Metal Dielectric (IMD) layer 54 has a second aperture of width W2 and height H2 formed therein where the first conformal Inter-Metal Dielectric (IMD) layer 54 is formed into the first aperture.

Analogously to the planarized Pre-Metal Dielectric layer 50, the first conformal Inter-Metal Dielectric (IMD) layer 54 may also be formed through methods and materials as are known in the art. Conformal insulator layers may be formed from materials including but not limited to silicon oxide materials, silicon nitride materials and silicon oxynitride materials, formed upon the surfaces of semiconductor substrates through methods including but not limited to Chemical Vapor Deposition (CVD) methods, Plasma Enhanced Chemical Vapor Deposition (PECVD) methods and Physical Vapor Deposition (PVD) sputtering methods. For the preferred embodiment of the present invention, the first conformal Inter-Metal Dielectric (IMD) layer 54 may be formed from a dielectric material chosen from the group of dielectric materials consisting of silicon oxide dielectric materials, silicon nitride dielectric materials and silicon oxynitride dielectric materials. More preferably, the first conformal Inter-Metal Dielectric (IMD) layer 54 is formed of a silicon oxide dielectric material. Preferably, the first conformal Inter-Metal Dielectric (IMD) layer has a thickness of from about 500 to about 3000 angstroms. Preferably, the second aperture within the first conformal Inter-Metal Dielectric (IMD) layer 54 has a width W2 of from about 1000 to about 19000 angstroms and a height H2 of from about 5000 to about 10000 angstroms.

Also shown in FIG. 10 is the presence of a first planarizing Spin-On-Glass (SOG) insulator layer 56 which is formed to a thickness adequate to substantially planarize the surface of the integrated circuit structure and completely fill the second aperture. Methods and materials through which planarizing Spin-OnGlass insulator layers may be formed upon the surfaces of semiconductor substrates are known in the art of integrated circuit manufacture. Planarizing Spin-On-Glass (SOG) insulator layers may be formed of Spin-On-Glass (SOG) materials including but not limited to inorganic silicate Spin-On-Glass (SOG) materials and organo-functional siloxane Spin-On-Glass (SOG) materials, typically although not exclusively formed upon the surfaces of semiconductor substrates through spin coating methods.

For the preferred embodiment of the present invention, the first planarizing Spin-On-Glass (SOG) insulator layer 56 is preferably formed from a Spin-On-Glass (SOG) material chosen from the group of Spin-On-Glass (SOG) materials consisting of inorganic silicate Spin-On-Glass (SOG) materials and organo-functional siloxane Spin-On-Glass (SOG) materials. In order to assure optimal filling of the first planarizing Spin-On-Glass (SOG) insulator layer 56 into the second aperture within the first conformal Inter-Metal Dielectric (IMD) layer 54, the Spin-On-Glass (SOG) material from which is formed the first planarizing Spin-On-Glass insulator layer 56 preferably has a viscosity of from about 1 to about 4 centipoise, as coated.

Figure 11:
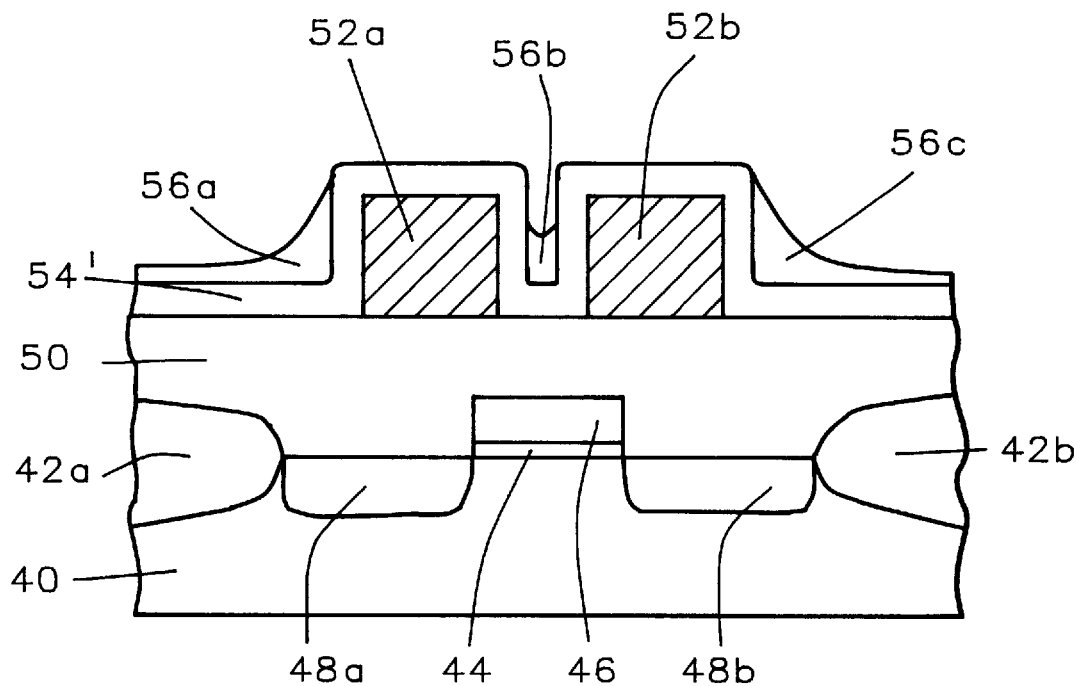

Referring now to FIG. 11 there is shown a schematic cross-sectional diagram illustrating the results of further processing of the integrated circuit whose structure is illustrated in FIG. 10. Shown in FIG. 11 is the presence of first Spin-On-Glass (SOG) insulator layer residues 56a, 56b and 56c formed through incomplete etching of the first planarizing Spin-On-Glass insulator layer 56. In the preferred embodiment of the present invention, the first planarizing Spin-On-Glass insulator layer 56 is etched to form the first Spin-On-Glass (SOG) insulator layer residues 56a, 56b and 56c through a selective and isotropic etch whereby the first conformal Inter-Metal Dielectric (IMD) layer 54 is only minimally etched in forming the etched first conformal Inter-Metal Dielectric (IMD) layer 54'.

Methods and materials through which planarizing Spin-On-Glass (SOG) insulator layers may be selectively and isotropically etched while minimally affecting conformal Inter-Metal Dielectric (IMD) layers which reside beneath those planarizing Spin-On-Glass (SOG) insulator layers are known in the art. Such methods include but are not limited to wet chemical etch methods and certain configurations of Reactive Ion Etch (RIE) etch methods. Materials employed in such methods are chosen consistently with the material from which is formed the planarizing Spin-On-Glass (SOG) insulator layer which is desired to be etched and the conformal Inter-Metal Dielectric (IMD) layer which is desired to be only minimally etched.

To achieve optimal etching of the first planarizing Spin-On-Glass (SOG) insulator layer 56 in forming the first Spin-On-Glass (SOG) insulator layer residues 56a, 56b and 56c while simultaneously minimally etching the first conformal Inter-Metal Dielectric (IMD) layer 54 to form the etched first conformal Inter-Metal Dielectric (IMD) layer 54', the preferred embodiment of the present invention preferably employs a selective and isotropic etch having a SOG:IMD etch selectivity of from about 5:1 to about 10:1. More preferably, although not exclusively, the selective and isotropic etch is a wet chemical etch. Most preferably, although not exclusively, the wet chemical etch is a dilute hydrofluoric acid etch having a concentration of from about 100:1 to about 200:1 or a Buffered Oxide Etchant (BOE) wet chemical etch.

Figure 12:
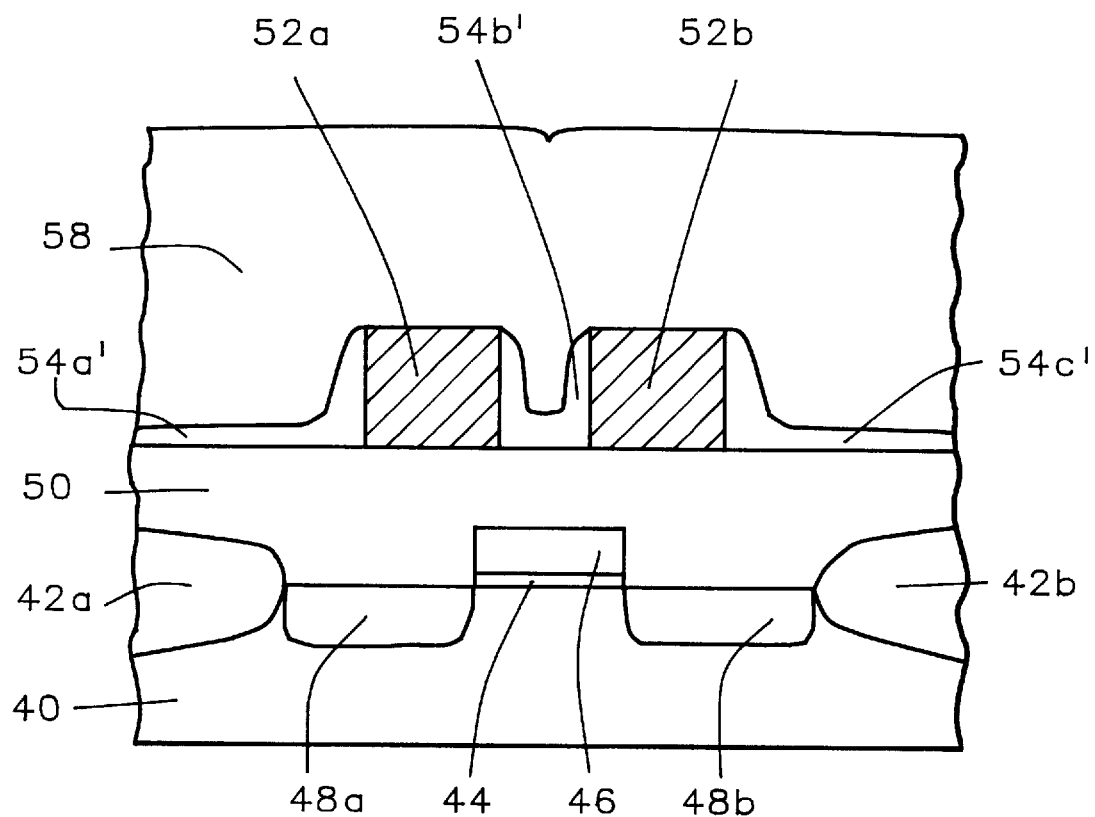

Referring now to FIG. 12, there is shown a schematic cross-sectional diagram illustrating further stages in processing of the integrated circuit whose structure is illustrated in FIG. 11. Shown in FIG. 12 is the presence of first Inter-Metal Dielectric (IMD) spacer layers 54a', 54b' and 54c' which are formed through the sequential complete etching of the first Spin-On-Glass (SOG) insulator layer residues 56a, 56b and 56c followed by the partial additional etching of the first etched conformal Inter-Metal Dielectric (IMD) layer 54'. The preceding two sequential etch processes are preferably undertaken through a single non-selective and anisotropic etch.

Methods and materials through which Spin-On-Glass (SOG) insulator layer residues and underlying conformal Inter-Metal Dielectric (IMD) layers may be sequentially, non-selectively and anisotropically etched are known in the art. Such methods are typically, although not exclusively, Reactive Ion Etch (RIE) etch methods employing Reactive Ion Etch (RIE) etch species appropriate to the materials from which are formed the Spin-On-Glass (SOG) insulator layer residues and the underlying conformal Inter-Metal Dielectric (IMD) layers.

In order to provide an optimal profile to the first Inter-Metal Dielectric (IMD) spacer layers 54a', 54b' and 54c', which are formed through the sequential, non-selective and anisotropic complete etching of the first Spin-On-Glass insulator layer residues 56a, 56b and 56c, and partial etching of the etched first conformal Inter-Metal Dielectric layer 54a', the method of the preferred embodiment of the present invention preferably employs a non-selective and anisotropic etch having a SOG:IMD etch selectivity of from about 1:1 to about 2:1. More preferably, although not exclusively, the non-selective and anisotropic etch is a Reactive Ion Etch (RIE) etch. Most preferably, although not exclusively, the Reactive Ion Etch (RIE) etch employs an active fluorine specie.

Also shown in FIG. 12 is the presence of a first conformal insulator layer 58 formed: (1) upon the surfaces of the first Inter-Metal Dielectric (IMD) spacer layers 54a', 54b' and 54c', and (2) between and upon the surfaces of the first high aspect ratio narrowly spaced patterned conductor layers 52a and 52b. Consistent with the object of the present invention, the first conformal insulator layer 58 is formed void free. The first conformal insulator layer 58 is preferably formed through methods and materials analogous to the methods and materials through which is formed the planarized Pre-Metal Dielectric (PMD) layer 50. Preferably, the first conformal insulator layer 58 is formed of a silicon oxide material formed through a Plasma Enhanced Chemical Vapor Deposition (PECVD) method, as is common in the art. Preferably, the first conformal insulator layer 58 has a thickness of from about 10000 to about 20000 angstroms.

As is understood by a person skilled in the art, additional high aspect ratio narrowly spaced patterned conductor layers, additional Spin-On-Glass (SOG) residue free Inter-Metal Dielectric (IMD) spacer layers and additional conformal insulator layers may be formed upon the integrated circuit structure illustrated in FIG. 12 to provide an integrated circuit with greater levels of interconnection complexity. An integrated circuit possessing such additional layers is illustrated by reference to the schematic cross-sectional diagram shown in FIG. 13.

Figure 13:
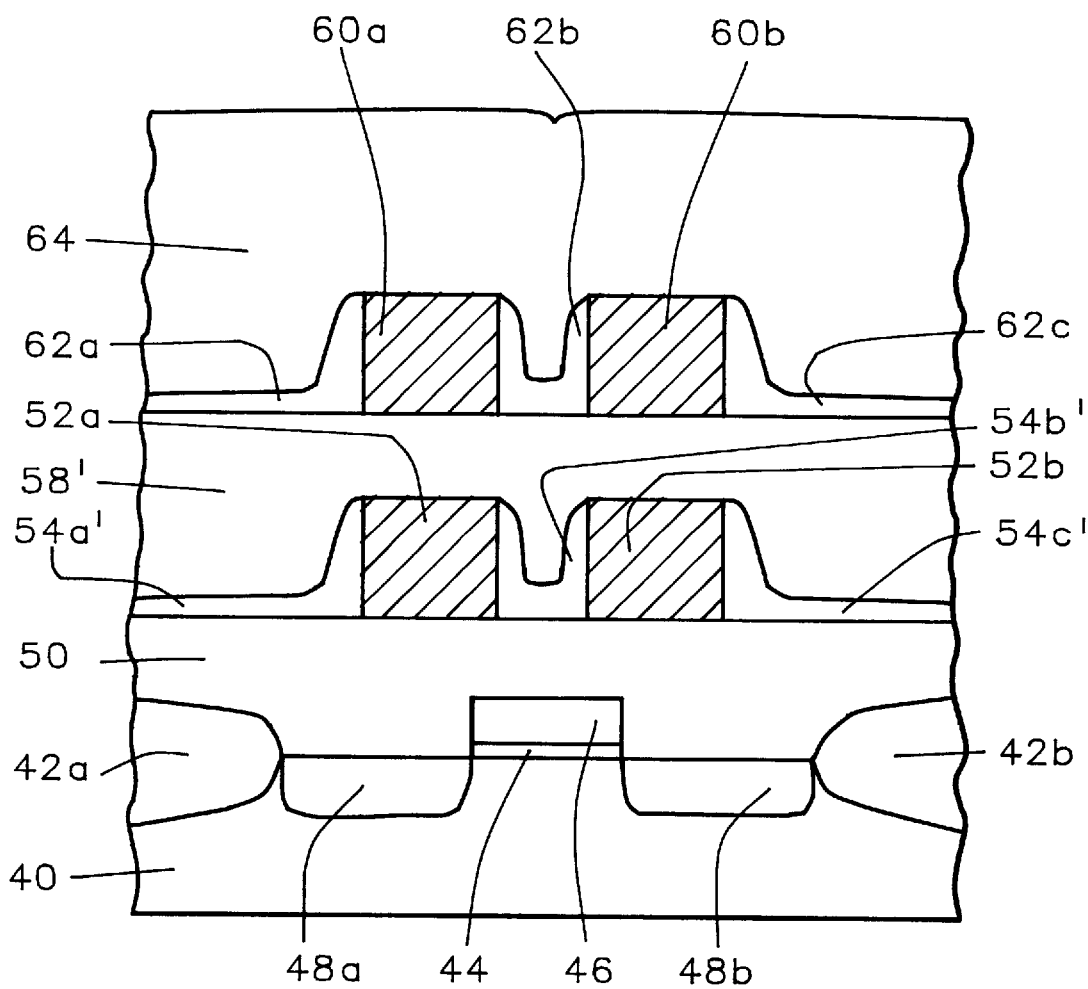

Shown in FIG. 13 is the presence of planarized first conformal insulator layer 58' which is formed through planarizing, through methods as are convention in the art of the first conformal insulator layer 58. Analogously to the planarized Pre-Metal Dielectric (PMD) layer 50, the planarized first conformal insulator layer 58' may be planarized through planarizing methods including but not limited to Reactive Ion Etch (RIE) etch-back planarizing methods and Chemical Mechanical Polish (CMP) planarizing methods. Also shown in FIG. 13 is the presence of: (1) second high aspect ratio narrowly spaced patterned conductor layers 60a and 60b, (2) second Inter-Metal Dielectric (IMD) spacer layers 62a, 62b and 62c, and (3) second conformal insulator layer 64. The second high aspect ratio narrowly spaced patterned conductor layers 60a and 60b may be formed through methods, materials and dimensions equivalent to the methods materials and dimensions employed in forming the first high aspect ratio narrowly spaced patterned conductor layers 52a and 52b. The second Inter-Metal Dielectric (IMD) spacer layers 62a, 62b and 62c may be formed through methods, materials and dimensions equivalent to the methods, materials and dimensions employed in forming the first Inter-Metal Dielectric (IMD) spacer layers 54a', 54b' and 54c'. Finally, the second conformal insulator layer 64 may be formed through methods, materials and dimensions equivalent to the methods, materials and dimensions employed in forming the first conformal insulator layer 58. Analogously to the first conformal insulator layer 58, the second conformal insulator layer 64 is also formed void free, when the second conformal insulator layer 64 is formed between and upon the second high aspect ratio narrowly spaced patterned conductor layers 60a and 60b adjoining which are first formed the second Inter-Metal Dielectric (IMD) spacer layers 62a, 62b and 62c through the method of the present invention.

Upon forming the second conformal insulator layer 64, there is formed the integrated circuit of the preferred embodiment of the present invention. The integrated circuit possesses a plurality of Spin-On-Glass (SOG) residue free Inter-Metal Dielectric (IMD) spacer layers between exceedingly narrowly spaced high aspect ratio narrowly spaced patterned conductor layers, the plurality of Spin-On-Glass (SOG) residue free Inter-Metal Dielectric (IMD) spacer layers serving as substrate layers upon which are formed void free conformal insulator layers.

As is understood by a person skilled in the art, the integrated circuit of the preferred embodiment of the present invention is illustrative of the present invention rather than limiting of the present invention. Revisions may be made to methods, materials, dimensions and structures through which is formed the preferred embodiment of the present invention while still forming an embodiment which is within the spirit and scope of the present invention.

What is claimed is:

1. A method for forming an Inter-Metal Dielectric (IMD) spacer layer comprising:

providing a semiconductor substrate having formed thereupon a patterned layer, the patterned layer having a first aperture formed therein;

forming upon the patterned layer and into the first aperture a conformal Inter-Metal Dielectric (IMD) layer, the conformal Inter-Metal Dielectric (IMD) layer having a second aperture formed therein where the conformal Inter-Metal Dielectric (IMD) layer is formed into the first aperture;

forming upon the Inter-Metal Dielectric (IMD) layer and filling the second aperture a planarizing Spin-On-Glass layer;

etching then selectively and isotropically through a selective and isotropic etch the planarizing Spin-On-Glass layer to leave remaining a Spin-On-Glass layer residue within the second aperture;

etching then non-selectively and anisotropically through a non-selective and anisotropic etch the Spin-On-Glass layer residue and the conformal Inter-Metal Dielectric (IMD) layer to leave remaining an Inter-Metal Dielectric (IMD) spacer layer adjoining the patterned layer.

2. The method of claim 1 wherein the first aperture has a width of from about 2000 to about 20000 angstroms and a height of from about 5000 to about 10000 angstroms.

3. The method of claim 1 wherein the conformal Inter-Metal Dielectric (IMD) layer is formed from a dielectric material chosen from the group of dielectric materials consisting of silicon oxide dielectric materials, silicon nitride dielectric materials and silicon oxynitride dielectric materials.

4. The method of claim 1 wherein the conformal Inter-Metal Dielectric (IMD) layer has a thickness of from about 500 to about 3000 angstroms.

5. The method of claim 1 wherein the second aperture has a width of from about 1000 to about 19000 angstroms and a height of from about 5000 to about 10000 angstroms.

6. The method of claim 1 wherein the planarizing Spin-On-Glass (SOG) insulator layer is formed from a Spin-On-Glass (SOG) material chosen from the group of Spin-On-Glass (SOG) materials consisting of inorganic silicate Spin-On-Glass (SOG) materials and organo-functional siloxane Spin-On-Glass (SOG) materials.

7. The method of claim 6 wherein the Spin-On-Glass (SOG) material has a viscosity of from about 1 to about 4 centipoise, as coated.

8. The method of claim 1 wherein the selective and isotropic etch has a SOG:IMD etch selectivity of from about 5:1 to about 10:1.

9. The method of claim 8 wherein the selective and isotropic etch is a wet chemical etch.

10. The method of claim 9 wherein the wet chemical etch is chosen from the group of wet chemical etches consisting of dilute hydrofluoric acid wet chemical etches having a concentration of from about 100:1 to about 200:1 and Buffered Oxide Etchant (BOE) wet chemical etches.

11. The method of claim 1 wherein the non-selective and anisotropic etch has a SOG:IMD etch selectivity of from about 1:1 to about 2:1.

12. The method of claim 11 wherein the non-selective and anisotropic etch is a Reactive Ion Etch (RIE) etch.

13. The method of claim 12 wherein the Reactive Ion Etch (RIE) etch employs an active fluorine specie.

14. A method for forming an Inter-Metal Dielectric (IMD) spacer layer comprising:

providing a semiconductor substrate having formed thereupon a patterned conductor layer, the patterned conductor layer having a first aperture formed therein;

forming upon the patterned conductor layer and into the first aperture a conformal Inter-Metal Dielectric (IMD) layer, the conformal Inter-Metal Dielectric (IMD) layer having a second aperture formed therein where the conformal Inter-Metal Dielectric (IMD) layer is formed into the first aperture;

forming upon the Inter-Metal Dielectric (IMD) layer and filling the second aperture a planarizing Spin-On-Glass layer;

etching then selectively and isotropically through a selective and isotropic etch the planarizing Spin-On-Glass layer to leave remaining a Spin-On-Glass layer residue within the second aperture;

etching then non-selectively and anisotropically through a non-selective and anisotropic etch the Spin-On-Glass layer residue and the conformal Inter-Metal Dielectric (IMD) layer to leave remaining an Inter-Metal Dielectric (IMD) spacer layer adjoining the patterned conductor layer.

15. The method of claim 14 wherein the patterned conductor layer is formed at least in part of an aluminum containing alloy.

16. The method of claim 14 wherein the first aperture has a width of from about 2000 to about 20000 angstroms and a height of from about 5000 to about 10000 angstroms.

17. The method of claim 14 wherein the conformal Inter-Metal Dielectric (IMD) layer has a thickness of from about 500 to about 3000 angstroms.

18. The method of claim 14 wherein the second aperture has a width of from about 1000 to about 19000 angstroms and a height of from about 5000 to about 10000 angstroms.

19. The method of claim 14 wherein the planarizing Spin-On-Glass (SOG) insulator layer is formed from a Spin-On-Glass (SOG) material chosen from the group of Spin-On-Glass (SOG) materials consisting of inorganic silicate Spin-On-Glass (SOG) materials and organo-functional siloxane Spin-On-Glass (SOG) materials.

20. The method of claim 19 wherein the Spin-On-Glass (SOG) material has a viscosity of from about 1 to about 4 centipoise, as coated.

21. The method of claim 14 wherein the selective and isotropic etch has a SOG:IMD etch selectivity of from about 5:1 to about 10:1.

22. The method of claim 14 wherein the non-selective and anisotropic etch has a SOG:IMD etch selectivity of from about 1:1 to about 2:1.

* * * * *